US006514785B1

United States Patent
Chiang et al.

(10) Patent No.: US 6,514,785 B1
(45) Date of Patent: Feb. 4, 2003

(54) CMOS IMAGE SENSOR N-TYPE PIN-DIODE STRUCTURE

(75) Inventors: An-Min Chiang, Hsin-Chu (TW); Chi-Hsiang Lee, Hua-Lien (TW); Wei-Kun Yeh, Hsin-Chu (TW); Hua-Yu Yang, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 12 days.

(21) Appl. No.: 09/590,125

(22) Filed: Jun. 9, 2000

(51) Int. Cl.$^7$ ................................................ H01L 21/00
(52) U.S. Cl. ........................ 438/48; 438/7; 438/48; 438/57; 438/59; 438/510; 438/514; 438/519; 257/113; 257/184; 257/186; 257/290; 257/292
(58) Field of Search ..................... 438/57–59, 48, 438/7, 510–514, 519; 257/113–118, 184–186, 290–92

(56) References Cited

U.S. PATENT DOCUMENTS

| | | | | |
|---|---|---|---|---|
| 4,286,177 A | * | 8/1981 | Hart et al. ..................... 307/296 |
| 4,680,637 A | * | 7/1987 | Sugiki ..................... 358/213.26 |
| 5,557,121 A | * | 9/1996 | Kozuka et al. ............. 257/292 |
| 5,563,426 A | * | 10/1996 | Zhang et al. ................. 257/66 |
| 5,644,156 A | * | 7/1997 | Suzuki et al. ............... 257/485 |
| 5,719,414 A | | 2/1998 | Sato et al. ................... 257/186 |
| 5,739,065 A | | 4/1998 | Lin ............................. 438/592 |
| 5,789,774 A | | 8/1998 | Merrill ....................... 257/292 |
| 5,841,176 A | | 11/1998 | Merrill ....................... 257/446 |
| 6,040,593 A | * | 3/2000 | Park ........................... 257/292 |
| 6,188,094 B1 | * | 2/2001 | Kochi et al. ................ 257/232 |
| 6,218,210 B1 | * | 4/2001 | Park ............................. 438/57 |
| 6,218,691 B1 | * | 4/2001 | Chung et al. ............... 257/290 |
| 6,225,670 B1 | * | 5/2001 | Dierickx ..................... 257/431 |
| 6,278,102 B1 | * | 8/2001 | Hook et al. ............... 250/208.1 |
| 6,281,531 B1 | * | 8/2001 | Kamashita et al. ......... 257/258 |
| 6,329,218 B1 | * | 12/2001 | Pan ............................. 438/57 |
| 6,414,342 B1 | * | 7/2002 | Rhodes ....................... 257/291 |
| 2002/0048837 A1 | * | 4/2002 | Burke et al. .................. 438/38 |

OTHER PUBLICATIONS

J. Walter et al. "Fully ion–implanted InP/InGaAs heterojunction FET fabrication in a photodiode layer structure for monolithic integration" Electronics Letters vol. 29 No. 18 Setp. 2, 1993 p. 1599–1600.*

Shou–Gwo et al. "High performance 0.25–$\mu$m CMOS color image technology with Non–silicide source/drain pixel" Electron Devices Meeting, 2000 IEDM Tech.Digest. p. 705–708.*

D. Romer et al. "700 Mb/s monolithically integrated four–channel receiver array OEIC using ion–implanted InGaAs JFET technology" IEE Photonics technology letters vol. 7 No. 5 May 1995, p. 543–545.*

\* cited by examiner

Primary Examiner—Matthew Smith
Assistant Examiner—Granvill D Lee, Jr.
(74) Attorney, Agent, or Firm—George O. Saile; Stephen B. Ackerman

(57) ABSTRACT

A method of forming an image sensor is disclosed. A partially processed semiconductor wafer is provide, containing p-type and/or n-type regions which are bounded by isolation regions and with gate oxide layers grown on the surfaces upon which gate electrode structures are disposed, some of said gate electrode structures will serve as gate electrodes of image sensor transistors. Ions are implanted to form source/drain structures about the said gate electrode structures. To form photodiodes ions are implanted in two steps overlapping a source/drain region. A deeper implant provides a low charge carrier density region and a shallow implant provides a high charge carrier density region near the surface. A blanket transparent insulating layer is deposited.

32 Claims, 2 Drawing Sheets

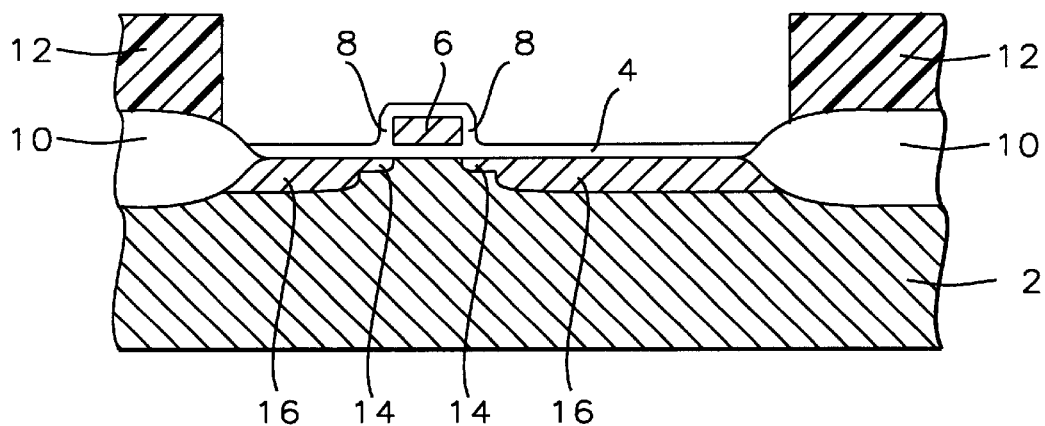
FIG. 1 – Prior Art
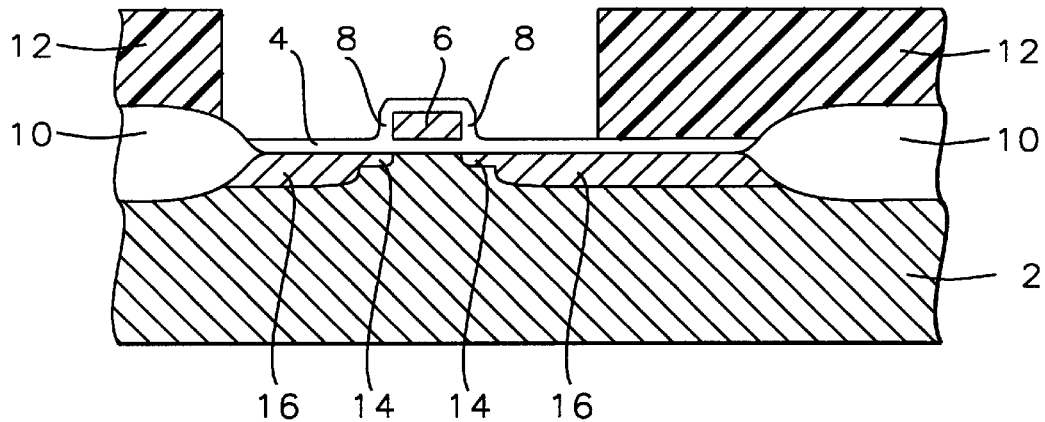
FIG. 2
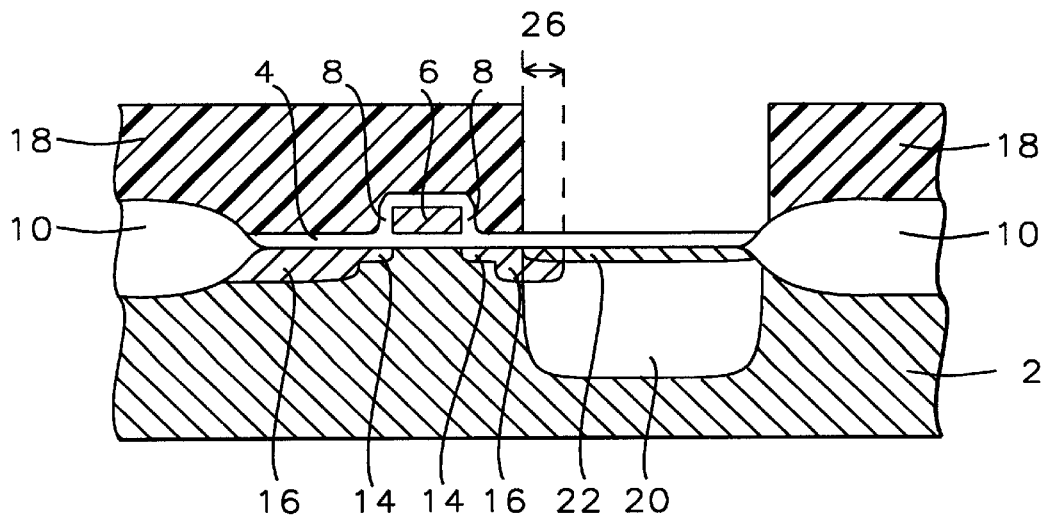
FIG. 3

CM OS IMAGE SENSOR N-TYPE PIN-DIODE STRUCTURE

BACKGROUND OF THE INVENTION (1) Field of the Invention

The present invention relates generally to image sensing devices and more particularly to such devices having high sensitivity photodiodes with very low dark current.

(2) Description of the Prior Art

Image sensors are utilized extensively in modern technology. U.S. Pat. No. 5,789,774 to Merrill shows a method of forming a pixel sensor cell with reduced leakage current that is achieved by eliminating field oxide from the cell and by appropriately biasing, during integration, every surface region of the cell that is not heavily doped. U.S. Pat. No. 5,841,176 to Merrill also shows a method of forming a pixel sensor with reduced leakage current, here this is achieved by utilizing a series of low doped regions to provide isolation between heavily doped regions of the cell. U.S. Pat. No. 5,719,414 to Sato et al. discloses a photodiode process using a boron or boron fluoride ion implantation into an n-type semiconductor substrate with an n-type impurity region in a rear surface. U.S. Pat. No. 5,739,065 to Lin teaches a method of fabricating a PIN photodiode.

Conventional image sensing devices often utilize junction photodiodes as the photosensitive device. The ion implants required to form these junction photodiodes are performed simultaneously with the source/drain implants of the adjacent FET and the photodiode implants are extensions of source/drain regions. This is shown in FIG. 1 Prior Art for a lightly doped drain (LLD) n– channel FET (NFET). Region 4 is a gate oxide grown over the surface of a p-well, 2. A polysilicon gate electrode, 6, is formed and a first, lower dose, implant is self-aligned to the gate electrode to achieve an n– region, 14, below the gate oxide extending to the field oxide, 10. An implant mask, 12, which could be photoresist, is disposed over the field oxide. Oxide spacers, 8, are then formed and a second, higher dose, implant is self-aligned to the oxide spacers. An n+ region, 16, is thus achieved, disposed under the n-region, separated from the gate electrode by about the thickness of the oxide spacer and extending to the field oxide. The n region of the junction photodiode thus formed is an extension of the FET drain. The characteristics of the implants forming this region, chosen to optimize the FET performance, are not likely to optimize the performance of the junction photodiode. For the photodiode, it is particularly important to choose implants that optimize sensitivity and minimize dark current.

SUMMARY OF THE INVENTION

Accordingly, it is a primary objective of the invention to provide a method of forming a CMOS image sensor that permits optimization of both the photodiode and the FET. This objective is achieved by performing the ion implantation of the photodiode separately from that of the FET and adjusting the implantation characteristics specifically to attain desired photodiode properties. A wide field region leads to high sensitivity. This can be achieved by having a wide intrinsic, or near intrinsic, region sandwiched between an n-type and p-type region. Sources of photodiode leakage generally accumulate near surfaces at imperfections where thermal charge carrier generation is enhanced. If these sources are within a minority carrier diffusion length of the field region they contribute to the dark current. When the majority carrier density is large the minority carrier diffusion length is small. Therefor by providing a sufficiently high doping density near the surface these sources of leakage are rendered ineffective.

In a preferred embodiment of the invention a partially processed n-type semiconductor substrate is provided in which a p-well or p-substrate has been formed. The surface of the p-well or p-substrate consists of a region of gate oxide bounded by field oxide. A conductive gate structure is disposed asymmetrically on the gate oxide. On one side a source/drain region can be accommodated under the gate oxide in an area bounded by the gate and the field oxide. On the other side, the area bounded by the gate and the field oxide can also accommodate a photodiode between a source/drain region and the field oxide, with some overlap of the photodiode and source/drain region. Using a mask that is open only over the gate, the source/drain regions the overlap region, a shallow, low dose, donor ion implantation is performed. Insulating spacers are then applied to the gate sidewalls by depositing an insulating layer and etching this layer with an anisotropic etch. Again using a mask that is open only over the gate, the source/drain regions and the overlap region, a deeper, higher dose, donor ion implantation is performed. LDD structures are thus attained for the source drain regions. Next, the photodiode implants are performed using a mask open only over the photodiode area and the area of overlap of the photodiode and source/drain. The first donor implant, giving rise to the field region of the photodiode, is deeper than the source/drain implants and provides a wide low-density n-type region. A high dose shallow donor implant is then performed, using the same mask, to attain an n++ region near the surface. A transparent insulating layer is now deposited.

In other preferred embodiments of the invention a lightly doped n-well is formed in the photodiode region. An n-channel transistor is then fabricated, preferably having the LDD structure. A high dose shall donor implant is performed followed by deposition of a transparent insulating layer.

Lightly doped drain structures for PMOS transistors on the substrate are achieved by first performing a shallow, low dose, acceptor ion implant. Insulating spacers on the gate are then fabricated concurrent with the insulating spacers of the NMOS transistors, including those of the image sensor. A deeper acceptor ion implant follows which is done before a shallow high dose acceptor implant. Deposition of a transparent insulating layer follows.

A method of forming an image sensor is disclosed. A partially processed semiconductor wafer is provide, containing p-type and/or n-type regions which are bounded by isolation regions and with gate oxide layers grown on the surfaces upon which gate electrode structures are disposed, some of said gate electrode structures will serve as gate electrodes of image sensor transistors. Ions are implanted to form source/drain structures about the said gate electrode structures. To form photodiodes ions are implanted in two steps overlapping a source/drain region and separated from the bird's beak. A deeper implant provides a low charge carrier density region and a shallow implant provides a high charge carrier density region near the surface. A blanket transparent insulating layer is deposited.

BRIEF DESCRIPTION OF THE DRAWINGS

In the accompanying drawings, forming a material part of this description, there is shown:

FIG. 1 Prior Art shows the layout and implant mask of a conventional CMOS image sensor.

FIG. 2 shows source/drain implant mask according to a preferred embodiment of the invention.

FIG. 3 shows photodiode and overlap implant mask.

DESCRIPTION OF THE PREFERRED EMBODIMENTS

Figure 4:
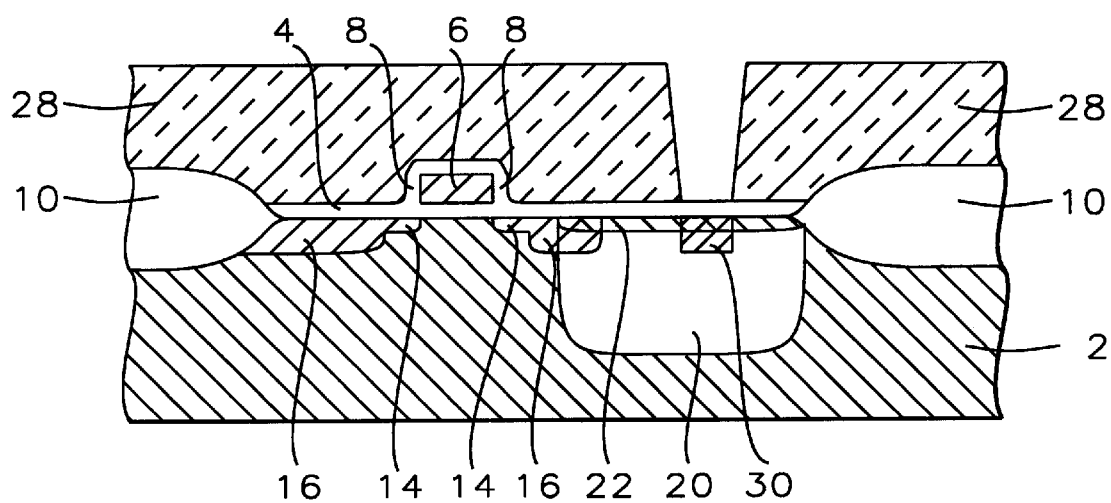
FIG. 4 shows image sensor layout

General principles of preferred embodiments of the invention are illustrated in FIGS. 2, 3 and 4. Referring to FIG. 2 there is shown a portion of a partially processed semiconductor by wafer. Region 2 is a p-well or p-substrate formed in an n-type semiconductor. Usually the semiconductor and p-well are silicon. A gate oxide layer, 4, is formed on the surface of the p-well or p-substrate and this layer is bounded by an isolation region, such as a field oxide, 10. Techniques for forming the gate oxide layer and isolation region are well known to those skilled in the art. Next a conductive gate electrode, 6, is formed; preferably of polysilicon or polycide, N about 0.35 to 1.0 micrometers wide and about 0.13 to 0.4 micrometers high. Procedures for forming conductive gate electrodes are well known to those skilled in the art. A source/drain implant mask, 12, preferably of photoresist, is then used to fabricate the source/drain regions. The opening starts just beyond the edge of the field oxide on the side closer to the gate electrode and extends, on the opposite side, from the edge of the gate electrode to the field oxide edge. The first of the LDD implants is then performed, resulting in a shallow, lightly doped n-type region, 14, self-aligned to the gate electrode and extending somewhat beyond the boundaries of the gate electrode and the mask opening. This is normally a phosphorus implant with a dose of about 1E13 to 1E14 per cm2 and at energy of about 40 to 70 keV.

To complete the LDD structure, insulating spacers, 8, are required at the edges of the gate electrode. As is well known to those skilled in the art, the spacers are formed by depositing an insulating layer to a thickness: of about that of the gate electrode and then etching it with an anisotropic reactive ion etch. This results in a spacer width at the gate oxide surface of between about 75% to about 85% of the insulating layer thickness. In a preferred embodiment of the invention the insulating layer is composed of TEOS. The purpose of the LDD structure is to alleviate problems associated with hot electron effects. After the spacers are formed, the second implant, which is deeper and of a higher dose, is performed using the same source/drain implant mask as in the first implant. A n+ region, 16, results that is self-aligned to the insulating spacers, extending somewhat under the spacers and somewhat beyond the implant mask boundary. Typically the second source/drain implant is arsenic with a dose of 1E15 to 5E15 per cm2 at an energy of between about 35 to 65 keV.

At this stage a photodiode implant mask, region 18 of FIG. 3, is used to fabricate the photodiode. The photodiode implant mask preferably consists of photoresist. As indicated in the figure the mask opening overlaps the source drain region and extends somewhat beyond the edge of the field oxide. Implants are now to be chosen to optimize the operation of the photodiode. Wider field regions, or depletion regions, provide larger photocurrents. Therefor the first of the photodiode implants is a deep implant, 20, preferably of phosphorous with a dose of about 1E12 to 1E14 per cm2 and at energy of about 50 to 180 keV. Defects have a tendency to accumulate near surfaces and could give rise to increased leakage current even to the extent that the pixel is inoperative. To avoid this, a second implant is performed to achieve a n+ region, 22, near the surface. Since the hole diffusion length is small in the n+ region, holes generated near the surface will not reach the field region. As a consequence the excessive charge carrier generation near the surface will not result in increased dark current. Region 22 is preferably fabricated using a phosphorous implant with a dose of about 1E15 to 1E16 per cm2 at energy of about 5 to 40 keV. High sensitivity image sensors with substantial improvements in yield and leakage over conventional photodiodes are achieved with these implants.

Referring again to FIG. 3, there is shown the photodiode implant mask, 18. Its opening extends over the photodiode area, overlapping a source/drain region by a distance 26. The overlap of the photodiode implants and the source/drain region is to insure electrical continuity between the photodiode and the transistor. Distance 26 can be about 0.3 to 0.7 micrometers.

The next step is to deposit a transparent insulating layer, 28, which in preferred embodiments of the invention could be BPTEOS, LPTEOS or PEoxide. Openings are made as usual for electrical contact, except contact is not made to the source/drain region on the photodiode side. Instead contact, 30, is made to a pad in the photodiode area. Procedures for depositing transparent insulating layers and fabricating contacts through such layers to underlying conducting regions are well known to those skilled in the art.

In alternative embodiments of the invention an n-well is formed, using the photodiode implant mask, to be the deep lightly doped part, 20, of the photodiode. The transistor is then fabricated, followed by implantation of the shallow n+ region of the photodiode, 22. At this point the structure is as depicted in FIG. 3. Deposition of a transparent insulating layer, forming contact openings and contact layers provides the same structure as FIG. 4.

While the invention has been particularly shown and described with reference to the preferred embodiments thereof, it will be understood by those skilled in the art that various changes in form and detail may be made without departing from the spirit and scope of the invention.

What is claimed is:

1. A method of forming an image sensor comprising:
   providing a partially processed semiconductor wafer containing p-type and/or n-type regions which are bounded by isolation regions and with gate oxide layers grown on the surfaces upon which gate electrode structures are disposed, some of said gate electrode structures will serve as gate electrodes of image sensor transistors;
   forming source/drain regions about the said gate electrode structures; the area to be photodiode regions being masked during said forming of source/drain regions;
   forming two photodiode regions of the same conductivity type as said source/drain regions and overlapping one of the source drain regions; one of the photodiode regions being shallow and of high carrier density and the other being deeper and of a lower carrier density; said source/drain regions, except for the areas of overlap, being masked during said forming of two photodiode regions;
   depositing a blanket transparent insulating layer;
   providing electrical contact through the transparent insulating layer to the gate structures, the overlapped source/drain regions and the photodiode regions.

2. The method of claim 1 wherein the said gate electrode structures are composed of polysilicon or polycide.

3. The method of claim 1 wherein the isolation region is composed of field oxide.

4. The methods of claim 1 wherein the semiconductor region is p-type and the source/drain regions are n-type.

5. The method of claim 1 wherein the semiconductor region is p-type silicon and the source/drain implant ions are arsenic and/or phosphorus.

6. The methods of claim 1 wherein the semiconductor region is n-type and the ions implanted to form the source/drain regions are acceptors.

7. The method of claim 1 wherein the semiconductor region is n-type silicon and the source/drain implant ions are boron and/or fluorine.

8. The method of claim 1 wherein the source/drain implant is accomplished in two stages; the first, providing regions near the gate that are lightly doped and the second, deeper, but overlapping, highly doped regions.

9. The method of claim 1 wherein the semiconductor region is p-type silicon and the source/drain implant is accomplished in two stages; the first being phosphorus to a dose of about 1E13 to 1E14 per cm2 at an energy of 40 to 70 keV and the second being arsenic to a dose of about 1E15 to 5E15 per cm2 at an energy of 35 to 65 keV.

10. The method of claim 1 wherein the semiconductor region is n-type silicon and the source/drain implant is accomplished in two stages; the first being BF2 to a dose of about 8E12 to 5E13 per cm2 at an energy of 30 to 50 keV and the second being BF2 to a dose of about 1E15 to 5E15 per cm2 at an energy 30 to 50 keV.

11. The method of claim 1 wherein the width of the gate electrode is between 0.5 to 1.5 micrometers.

12. The method of claim 1 wherein the width of the source/drain regions is between 0.35 to 1.0 micrometers.

13. The method of claim 1 wherein the width of the overlap region is between about 0.3 to 0.7 micrometers.

14. The method of claim 1 wherein the semiconductor region is p-type and the photodiode implant ions are donors.

15. The method of claim 1 wherein the semiconductor region is p-type silicon and the photodiode implant ions are phosphorus; to a dose of about 1E15 to 1E16 per cm2 at an energy of about 5 to 40 keV for the shallow photodiode region and to a dose of about 1E12 to 1E14 per cm2 at an energy of about 50 to 180 keV for the deeper photodiode region.

16. The method of claim 1 where in said blanket insulating layer is TEOS, BPTOES or PEoxide.

17. A method of forming an image sensor comprising:

providing a partially processed semiconductor wafer containing p-type and/or n-type regions which are bounded by isolation regions and with gate oxide layers grown on the surfaces;

forming a well of the opposite conductivity type of said semiconductor region to be deep, low carrier density photodiode region; regions to be source/drain regions, except for the region of overlap, being masked during said forming of said well;

forming gate electrode structures some of which will serve as gate electrodes of image sensor transistors;

forming LDD source/drain regions about said gate electrode structures, with source/drain regions of image sensors being of the same conductivity type as said well, and one of the source/drain regions overlapping said well; said well, except for region of overlap, being masked during said forming of LDD source/drain regions;

forming shallow, high density photodiode region overlapping said well and source/drain region; said source/drain regions, except for region of overlap, being masked during said forming of high density photodiode region;

depositing a blanket transparent insulating layer;

providing electrical contact through said transparent insulating layer to the gate structures, the unoverlapped source/drain regions and the photodiode regions.

18. The method of claim 17 wherein said well is n-type.

19. The method of claim 17 wherein said well is formed by implantation of phosphorous to a dose of about 1E12 to 1E14 at energy of about 50 to 180 keV.

20. The method of claim 17 wherein said well is p-type.

21. The method of claim 17 wherein the semiconductor region is p-type silicon and the LDD source/drain implant ions are arsenic and phosphorus.

22. The methods of claim 17 wherein the semiconductor region is n-type and the source/drain regions are p-type.

23. The method of claim 17 wherein the semiconductor region is n-type silicon and the source/drain implant ions are boron, fluorine or boron fluoride.

24. The method of claim 17 wherein the source/drain implant is accomplished in two stages; the first, provide Sightly doped regions near the gate and the second, deeper highly doped regions, insulating spacers, which can be TEOS, are formed between the two implant stages.

25. The method of claim 17 wherein the semiconductor region is p-type silicon and the source/drain implant is accomplished in two stages; insulating spacers, which can be TEOS, being formed between the stages, the first stage being phosphorus to a dose of about 1E13 to 1E14 per cm2 at an energy of 40 to 70 keV and the second being arsenic to a dose of about 1E15 to 5E15 per cm2 at an energy of 35 to 65 keV.

26. The method of claim 17 wherein the semiconductor region is n-type silicon and the source/drain implant is accomplished in two stages; the first being BF2 to a dose of about 8E12 to 5E13 per cm2 at an energy of 30 to 50 keV and the second being BF2 to a dose of about 1E15 to 5E15 per cm2 at an energy 30 to 50 keV, TEOS spacers being formed between the stages.

27. The method of claim 17 wherein the width of the gate electrode is between about 0.35 to 1.0 micrometers.

28. The method of claim 17 wherein the width of the source/drain regions is between about 0.5 to 1.5 micrometers.

29. The method of claim 17 wherein the width of the overlap region is between about 0.3 to 0.7 micrometers.

30. The method of claim 17 wherein the semiconductor region is p-type and the shallow photodiode implant ions are donors.

31. The method of claim 17 wherein the semiconductor region is p-type silicon and the shallow photodiode implant ions are phosphorus to a dose of about 1E15 to 5E16 per cm2 at an energy of 5 to 40 keV.

32. The method of claim 19 wherein said blanket insulating layer is TEOS, BPTEOS or PEoxide.

* * * * *